United States Patent [19]

Rohner

[11] Patent Number: 4,546,619

[45] Date of Patent: Oct. 15, 1985

[54] MECHANICAL COOLER FOR ELECTRONICS

[76] Inventor: Thomas G. Rohner, P.O. Box 80427, Midland, Tex. 79709

[21] Appl. No.: 624,218

[22] Filed: Jun. 25, 1984

[51] Int. Cl.[4] .............................. H02B 1/00; F28F 7/00
[52] U.S. Cl. ..................................... 62/419; 165/80.4; 361/385
[58] Field of Search ......................... 62/217, 498,348; 174/15 R, 15 H P; 324/158 T; 165/80 C; 361/385, 381, 382, 386, 384

[56] References Cited

U.S. PATENT DOCUMENTS

| | | | |
|---|---|---|---|
| 2,516,184 | 7/1950 | Christie | 361/384 |
| 3,275,921 | 9/1966 | Fellendorf et al. | 165/80 C |
| 3,334,684 | 8/1967 | Roush et al. | 165/80 C X |
| 3,437,132 | 4/1969 | Venema | 361/385 X |
| 3,946,276 | 3/1976 | Braun et al. | 361/385 |
| 4,009,423 | 2/1977 | Wilson | 361/385 |
| 4,115,836 | 9/1978 | Hutchison et al. | 361/385 X |
| 4,315,300 | 2/1982 | Parmerlee et al. | 361/384 |

*Primary Examiner*—William E. Wayner
*Attorney, Agent, or Firm*—Wendell Coffee

[57] ABSTRACT

To cool electronic heat producing elements and components which are normally connected to a heat sink, an evaporator containing a circulating coolant is thermally connected to each of the heat producing components. The evaporator absorbs the heat from the heat producing element. The coolant is boiled or evaporated within the evaporator. The pressure on the gas produced by the evaporation is maintained at a constant pressure. This will result in a uniform temperature of the liquid as it is being evaporated. The heat producing components, therefore, will be maintained at substantially a constant temperature. Several heat producing elements may be connected to a single evaporator. For retrofitting existing units, individual evaporators are made to attach to the heat sink between the heat producing component and the heat sink. If the housing is made air tight, then a circulating fan, circulating air within the enclosed housing will remove heat from other heat producing sources within the cabinet and transfer it to the heat sink, which will in turn transfer it to the evaporator pads.

7 Claims, 7 Drawing Figures

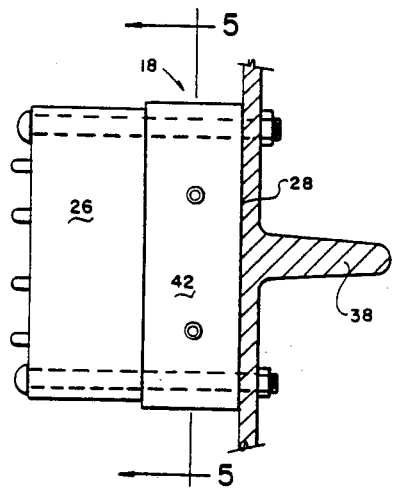
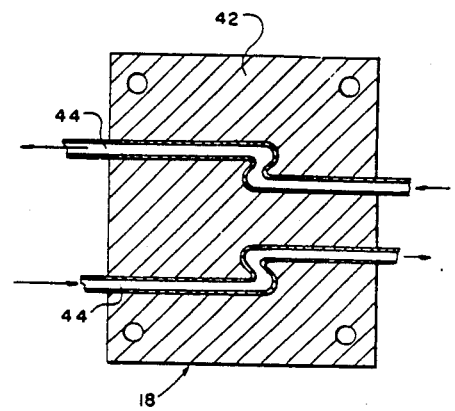
FIG-4  FIG-5
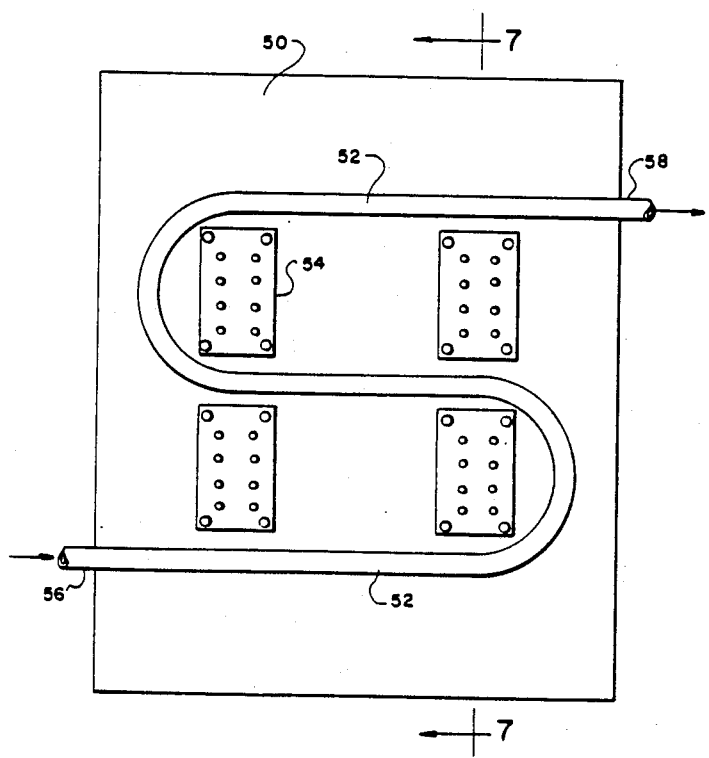
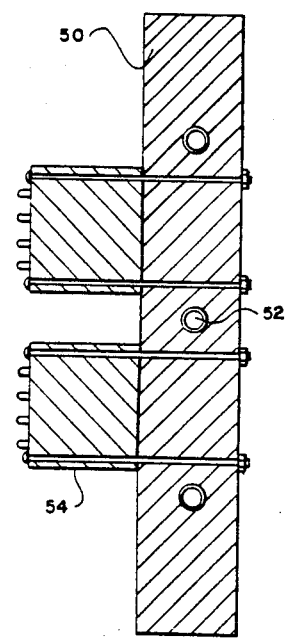
FIG-6  FIG-7

MECHANICAL COOLER FOR ELECTRONICS

BACKGROUND OF THE INVENTIONS (1) Field of the Invention

This invention relates to the cooling of electrical or electronic components and elements. More particularly, this invention relates to the cooling of electronic elements by thermal conductive contact with an evaporating coolant.

(2) Description of the Prior Art

Many electrical components or elements are heat producing. The various components or elements such as semiconductors, magnetic elements, resistors, and capacitors dissipate heat. The components operate at a higher capacity if the temperature is maintained low. Therefore, it is necessary to provide cooling for these components and elements to work efficiently at a high capacity.

An often used method is to mount the components upon a heat sink. This basically is a mounting plate which is made of metal having good thermal conductivity such as aluminum. Normally, the heat sink will be finned to increase the transfer of heat to air which is circulated around the heat sink.

A variation of this basic system is liquid cooling the mounting plate or heat sink by laminating a water cooled panel in the sink. This replaces air passing over the fins. Such a device is shown in the Wilson patent, U.S. Pat. No. 4,009,423.

Refrigeration is a well known method of cooling. By refrigeration, it is normally meant using a liquid coolant which is evaporated in an evaporator at the point where material is to be cooled. The gas from the evaporator is connected by conduits in various controls and the like to an inlet of a compressor. The compressor compresses the gases to a high pressure. Most of the high pressure gases are cooled in a condenser so that they form a liquid. The liquid is passed through an expansion valve to a conduit which connects it to the evaporator. The temperature of the evaporating liquid or boiling liquid will be determined by the pressure upon the coolant at that point.

Other workers in the field have sought to improve the efficiency of the heat sink by using refrigerated air to blow over a finned heat sink. As applicant understands the disclosure of the patents, it appears that Anderson, U.S. Pat. No. 4,352,274, and German Pat. No. DT2828374, and German Pat. No. DL0148,703 are of this type.

Before this patent application was filed, applicant caused a search to be made in the U.S. Patent and Trademark Office. This search, in addition to the four patents identified above, also disclosed the following patents:

Purdy et al U.S. Pat. No. 3,648,167
Kauffman U.S. Pat. No. 4,394,530

These two patents are not believed to be directly related to applicant's invention, but the applicant thought they would be of interest to the Examiner inasmuch as they were reported by an experienced patent searcher.

Purdy et al discloses a device for testing power semiconductor devices wherein the device is placed in a clamp and cooled by a circulating coolant which transfers heat from the device to the circulating coolant through a metal plate.

SUMMARY OF THE INVENTION:

(1) New Functions and Surprising Results

I have invented a cooler for cooling the electronic equipment which is readily adapted to be installed on existing installation as well as installed on new installations.

According to my invention, the heat producing component is thermally conductively connected to a refrigeration evaporator. Therefore, the component will be maintained at, or near the temperature of the evaporating liquid within the evaporator as determined by the pressure upon the produced gases.

In newly designed equipment, several components could be placed upon an evaporator. Inasmuch as often the mounting plate of a electronic assembly has an electrical potential other than ground, it may be that it would be desirable to have several evaporators, each evaporators having those components mounted thereon, having a common mounting potential. Most commercial refrigerant liquids are not electrically conductive and are readily carried by hoses which are nonconductive electrically, the same refrigerant system may be used for all the evaporators.

To retrofit existing assemblies, small evaporators are provided to act as pads between the heat producing component and the existing heat sink. For example, if thirteen components are presently mounted upon a heat sink, then thirteen pads would be connected, one pad between each component and the heat producing sink. Therefore, the placement and the wiring between components would remain the same and only the distance between the components and the heat sink would be changed.

According to this description, it may be seen that the heat sink, as well as the component will be cooled and will be the approximate temperature of the several evaporators. Therefore, if the housing containing the components and the heat sinks is closed to be air tight, the same air within the housing can be continuously circulated, transfering heat from other components within the housing or cabinet into the heat sink where the heat will be removed with the evaporated gases to the inlet of the compressor or the refrigeration system. Since the air within the container is recirculated, it can be kept less contaminated.

(2) Objects of this Invention

An object of this invention is to cool the components of an electrical assembly.

Further objects are to achieve the above with a device that is sturdy, compact, durable, lightweight, simple, safe, efficient, versatile, ecologically compatible, energy conserving, and reliable, yet inexpensive and easy to manufacture, install, adjust, operate and maintain.

Other objects are to achieve the above with a method that is versatile, ecologically compatible, energy conserving rapid, efficient, and inexpensive, and does not require highly skilled people to install, adjust, operate, and maintain.

The specific nature of the invention, as well as other objects, uses, and advantages thereof, will clearly appear from the following description and from the accompanying drawing, the different views of which are not scale drawings.

BRIEF DESCRIPTION OF THE DRAWINGS

FIG. 4 is a side sectional view of the pad taken on line 4—4 of FIG. 3.

FIG. 5 is a front sectional view of an evaporator pad taken on line 5—5 of FIG. 4.

FIG. 6 is a front elevational view of an evaporator with a plurality of electrical components attached thereto.

FIG. 7 is a side sectional view of the evaporator as shown in FIG. 6 taken substantially on lines 7—7 of FIG. 6.

DESCRIPTION OF THE PREFERRED EMBODIMENTS

Figure 1:
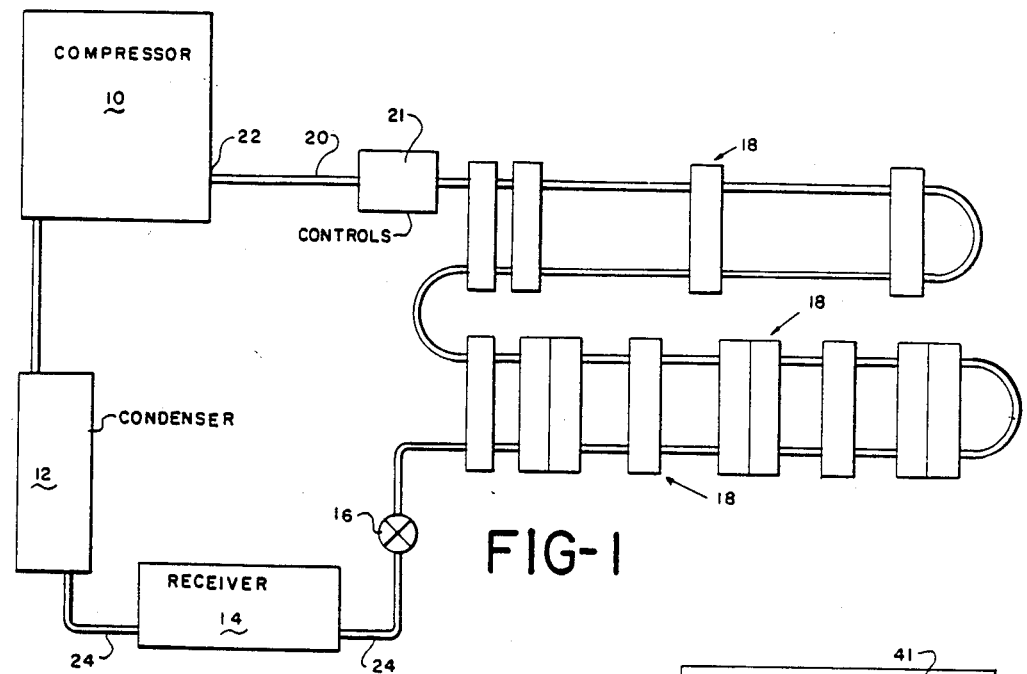
FIG. 1 is a schematic representation of the basic refrigeration cycle with the plurality of evaporator pads according to this invention.

FIG. 1 is basically a schematic view showing the refrigeration and the evaporating cicuit.

The refrigeration system includes compressor 10. The compressed coolant gas from the compressor passes through the condenser 12 and from there the liquid coolant would go to receiver 14. From receiver 14, the coolant would pass through expansion valve 16 to evaporators 18. Gas conduit 20 carries the gas coolant back from the evaporators to the inlet 22 of the compressor. Likewise, liquid conduit 24 extends from condenser 12 through receiver and expansion valve to evaporators 18. Refrigeration systems are well known, many of the refinements and truly necessary elements have not been shown in the drawing. For example, different filters and dryers for the refrigerant material or coolant are not shown, or the sight glasses to show the presence or absence of liquid. The controlled expansion valve has been shown merely as a valve. The controls 21, schematically shown, would be related both to the temperature and the pressure of the gases returning to the compressor. Such controls as the head pressure control valve or the discharge bypass valve, or the crankcase pressure regulator valve with the various conduits and connections from all of these elements have not been shown inasmuch as they are standard and well known to those having ordinary skill in the refrigeration arts. Also, these parts do not form a part of this invention.

Figure 2:
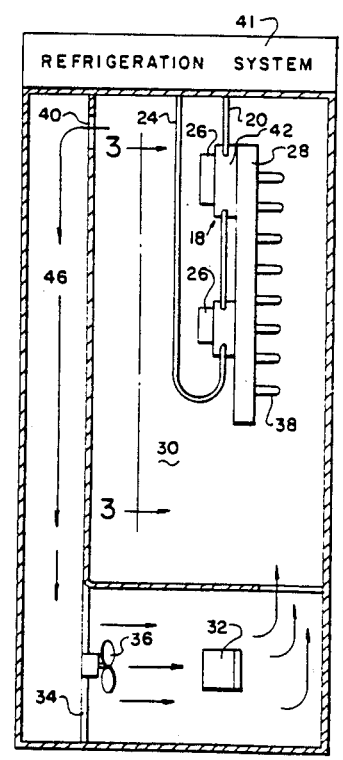
FIG. 2 is a schematic representation of a heat sink in a cabinet having a electrical assembly therein with the cooling system according to this invention.

FIG. 2 is a somewhat schematic representation of a typical installation to, or retrofit of an existing unit.

As may be seen, the electrical assembly includes a plurality of electrical heat producing components 26 mounted upon heat sink 28. Electrical assembly is used in a broad sense to include electronic assemblies or circuits using solid state elements or microprocessing units and the like. The heat sink and components are mounted in cabinet 30. The cabinet has other or additional heat producing components 32. Also, the cabinet in it original condition has opening 34 in the bottom with fan 36 to circulate air through the cabinet and across fins 38 of the heat sink 28. Before modification, the air exits through exhaust opening 40 at the top of the cabinet.

To change such an installation to a refrigerated cooled system, a refrigeration system 41 would be mounted upon the top of the cabinet. It is understood the refrigeration system would include a compressor, condenser, expansion valves, and all the additional valves, controls and conduits for operation. The evaporators 18 would be in the form of individual pads 42. The pads would have cavities 44 or passages within them so that they formed receptacles, containers, receivers, vessels, or whatever the evaporator might be considered. The cavity would be in the shape of a passageway extending through the pad. As seen particularly in FIGS. 2 and 4, the pads would be rather flat so that they would readily fit between the electrical component 26 and the heat sink 29. The pad would be made of good thermal conductors such as aluminum or copper. The bolts by which the components 26 are normally attached to the heat sink 28 would be replaced by longer bolts so that they could extend through both the component and the heat sink and clamp the component 26 firmly to the evaporator pad 42 and also the evaporator pad firmly to the heat sink 28. As outlined above, the heat from the component 26 would flow by thermal conductivity into the evaporator 18 and into the liquid coolant within the cavity 44. Furthermore, any heat resulting from the circulating air (or gas, if such were desirable in a special situation) circulated by fan 36 would also transfer heat by convection to the fins 38 of the heat sink 28. From there heat would be transferred by thermal conduction to the pads and there again to the coolant within the cavity 44. It may be readily seen that both the heat sink 28 and the evaporators 18 are thermally conductively connected to the liquid coolant within the cavity 44.

The cabinet 30 would also have the normal door or front supplemented or replaced by hollow door 46 so that there would be a closed path for the air to pass from the exhaust 40 through the hollow door to the lower opening 34 to be driven by the fan 36 past the additional components 32. In this case, the air itself would be cooled by the fins 38, and therefore, the function of the heat sink, would be reversed. I.e., the heat sink would not transfer heat from the elements or components thermally connected to it into the air, but the reverse would occur. The air would transfer heat to the heat sink, and thus into the evaporator pads.

Referring to FIG. 5, it may be seen that the passages or cavities 44 through the evaporators are not straight. I.e., that the passages are illustrated as serpentine. It will be understood that the coolant will begin basically as liquid with, perhaps, a little gas therein. However, as the coolant gains additional heat, more of the coolant will evaporate so that the fluid flowing through the conduits and the evaporators will be a mixture of gas and liquid. Particularly in the latter stages, the coolant fluid will be primarily gas with a mist or droplets of liquid carried therewith. It will be understood that although the coolant might be primarily gas with only small droplets or mist, that still, the cavity would have liquid therein and there would be a liquid coolant in the cavity. For good heat transfer, it is desirable that these droplets of liquid contact the walls of the cavity. Therefore, I prefer that the passages be serpentine.

Figure 3:
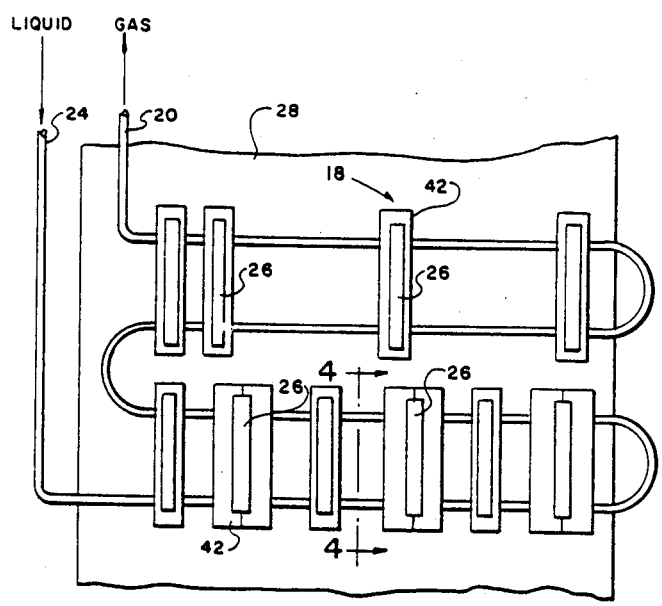
FIG. 3 is a front elevational view of the heat sink with the evaporator pad according to this invention.

Referring particularly to FIGS. 1, 3, and 5, it may be seen that the evaporators as illustrated therein, each have both a first passageway and a second passageway. The conduit forms a means for connecting the first passageways of several of the evaporators in a series. Also, the conduit forms a means for connecting several of the second passageways of several of the evaporators in a series. The conduit also forms a means for connecting the series of the first passages in succession to the series of second passageways. I.e., that the coolant first flows through the first passageway of several of the evaporators and then flows through the second passageway of several evaporators. Of course, as illustrated, this is repeated. I.e., the coolant flows through the first passageway of the lower eight evaporators and then through the second passageway of the lower evaporators. Thereafter, the same coolant flows through the lower or first passageway of the upper five evaporators and then flows through the second passageway of the upper five evaporators. In the event of severe loading so that the refrigeration system is at or near its load limit, it may be seen that normally all of the components attached to the lower eight evaporators will have liquid coolant within the first passages of these evaporators. Further, even in the upper five evaporators having electrical components attached to them, that in all likelyhood, there will be considerable liquid in the first passageways of all five of these evaporators. There might or might not be liquid in the second passageways of the upper five evaporators. However, the components in this area would not be without cooling.

Also, the cooling system has been referred to as the refrigeration system. The preferred temperature at this time for the coolant is about 50° F. (10° C.). Although any of several refrigerants may be used, it will be understood that refrigerants such as Freon R-12 at 50 psig boils, or has a boiling, evaporation, or condensing temperature of about 50° F. Other suitable refrigerants might be R-22, which at about 84 psig has an evaporating, or condensing temperature of about 50° F.

The only criteria for the coolant is that it operates satisfactory at the temperature range and that also, it be nonconductive.

The embodiment disclosed above is ideally suited for modifying existing units for refrigerant or evaporative cooling rather than air cooled or the like. It will be seen that there is no necessity for changing the wiring layout or the placement of the various elements or to make any changes at all.

The embodiment shown in FIGS. 6 and 7 are well adopted for installations particularly designed to use refrigerated coolant. As illustrated, mounting plate 50 is itself in the form of an evaporator. I.e., that it has a serpentine cavity 52 extending through it. It is of sufficient size that a plurality of heat producing components 54 may be mounted thereon. Although not shown, it will be understood that coolant at low pressure, normally in the liquid form, would be introduced at the evaporator entrance 56 and would be exhausted as evaporator exit 58. During the passage from the entrance 56 to the exit 58, it would pick up heat as it passes through the cavity. The conduit between mounting plates 50 would preferrably be by a nonconductive conduit so that each mounting plate could be at any desired potential. I.e., the different mounting plates could be at different potentials according to the design of the electrical assemblies. Obviously, if the heat conductivity and heat transfer were not large enough to sufficiently cool the electrical components, those having ordinary skill in the refrigerant arts would understand that the size of the cavity 52 within the mounting plates 50 could be increased either by increasing the diameter of the cavity or increasing the total length of the passageways forming the cavity.

The embodiments shown and described above are only exemplary. I do not claim to have invented all the parts, elements or steps described. Various modifications can be made in the construction, material, arrangement, and operation, and still be within the scope of my invention.

The limits of the invention and the bounds of the patent protection are measured by and defined in the following claims. The restrictive description and drawing of the specific examples above do not point out what an infringement of this patent would be, but are to enable the reader to make and use the invention.

As an aid to correlating the terms of the claims to the exemplary drawing, the following catalog of elements is provided:

| | | | |
|---|---|---|---|
| 10 | Compressor | 36 | Fan |
| 12 | Condenser | 38 | Fins |
| 14 | Receiver | 40 | Exhaust |
| 16 | Expansion Valve | 41 | Refrigeration System |
| 18 | Evaporator | 42 | Pads |
| 20 | Gas Conduit | 44 | Cavity |
| 21 | Controls | 46 | Hollow Door |
| 22 | Inlet | 50 | Mounting Plate |
| 24 | Liquid Conduit | 52 | Cavity |
| 26 | Components | 54 | Components |
| 28 | Heat Sink | 56 | Evaporator |
| 30 | Cabinet | 58 | Evaporator Exit |
| 32 | Addition | | |
| 34 | Opening | | |

I claim as my invention:

1. In an electrical assembly having:
   a. at least one heat sink and
   b. a plurality of heat producing electrical elements mounted on the heat sink;
   c. the improved structure for cooling the elements comprising:
   d. a pad between each element and the heat sink, the pad directly thermally conductively connected to both the element and heat sink,
   e. a first passage in each of the pads, and
   f. a compressor,
   g. a condenser, and
   h. conduits connecting the compressor, condenser and the pads, whereby
   i. coolant is evaporated in at least some of the pads.

2. The invention as defined in claim 1 having all the limitations of a. through i. further comprising:
   j. the passage in some of the pads being serpentine.

3. The invention as defined in claim 1 having all the limitations of a. through i. further comprising:
   j. at least some of the pad having a second passage, and
   k. the conduits forming means for
   (i) connecting the first passages of several of the pads in series, then
   (ii) connecting the second passages of several of the pads in series, and also
   (iii) connecting the series through the first passages in succession to the series through the second passages.

4. The invention as defined in claim 1 having all the limitations of a. through i. wherein:
   j. the heat sink and elements are enclosed in
   k. a housing containing
   l. separate heat producing components not mounted on the heat sink; and further comprising:

m. a ventilating fan in the housing to circulate air in the housing and transfer heat from the separate components to the heat sink, and thus to the pads.

5. The invention as defined in claim 4 having all the limitations of a. through m. further comprising:

n. the passage in some of the pads being serpentine.

6. The invention as defined in claim 5 having all the limitations of a. through n. further comprising:

o. at least some of the pad having a second passage, and p. the conduits forming means for
 (i) connecting the first passages of several of the pads in series, then
 (ii) connecting the second passages of several of the pads in series, and also
 (iii) connecting the series through the first passages in succession to the series through the second passages.

7. The process of cooling an electrical assembly having a plurality of heat producing components comprising:

a. directly thermally connecting at least one of the components to an evaporator having a cavity, b. thermally conductively connecting several evaporators, each with a cavity, to a heat sink, c. evaporating a coolant within the cavities of the evaporators, d. drawing the gaseous coolant from the cavities by a compressor, and e. circulating air around the heat sink, thereby f. transferring heat from the other sources to the heat sink and evaporators.

* * * * *